(12) United States Patent
Chen et al.

(10) Patent No.: US 8,283,716 B2
(45) Date of Patent: Oct. 9, 2012

(54) HIGH PERFORMANCE FLASH MEMORY DEVICES

(75) Inventors: Derek Chen, Mount Kisco, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 12/688,929

(22) Filed: Jan. 18, 2010

(65) Prior Publication Data
US 2010/0187592 A1    Jul. 29, 2010

Related U.S. Application Data

(60) Provisional application No. 61/148,060, filed on Jan. 29, 2009.

(51) Int. Cl.
*H01L 29/788* (2006.01)
*H01L 21/28* (2006.01)

(52) U.S. Cl. .......... 257/315; 257/E29.129; 438/593

(58) Field of Classification Search .......... 257/316, 257/593, E29.3, E21.209, 239, 261, 314, 257/315, 320, 321, E29.129, E21.179, E21.422, 257/E21.68, E21.687, E21.613; 438/201, 438/211, 257, 593
See application file for complete search history.

(56) References Cited

U.S. PATENT DOCUMENTS

| 5,240,558 | A | 8/1993 | Kawasaki et al. | |
|---|---|---|---|---|
| 6,069,383 | A | 5/2000 | Yu | |
| 6,876,032 | B2 | 4/2005 | Hsieh | |
| 7,394,131 | B2 | 7/2008 | Steigerwalt et al. | |
| 2006/0110883 | A1 | 5/2006 | Min | |
| 2006/0240623 | A1 | 10/2006 | Lee et al. | |
| 2006/0281244 | A1* | 12/2006 | Ichige et al. | 438/211 |
| 2007/0200165 | A1* | 8/2007 | Jeong et al. | 257/315 |
| 2008/0064164 | A1 | 3/2008 | Dong | |
| 2008/0315286 | A1 | 12/2008 | Ieda | |

OTHER PUBLICATIONS

International Search Report dated Jun. 4, 2010.

* cited by examiner

*Primary Examiner* — Victor A Mandala
*Assistant Examiner* — Selim Ahmed
(74) *Attorney, Agent, or Firm* — Cantor Colburn LLP; Katherine Brown

(57) ABSTRACT

A flash memory device includes a wafer; a gate oxide layer disposed upon the wafer; a floating gate disposed upon the gate oxide layer, the wafer, or a combination thereof; the floating gate including a flat floating gate portion and a generally rectangular floating gate portion disposed upon selected areas of the flat floating gate portion; a high K dielectric material disposed upon the floating gate; and a control gate disposed upon the high K dielectric material; wherein the high K dielectric material forms a zigzag pattern coupling the floating gate with the control gate.

20 Claims, 16 Drawing Sheets

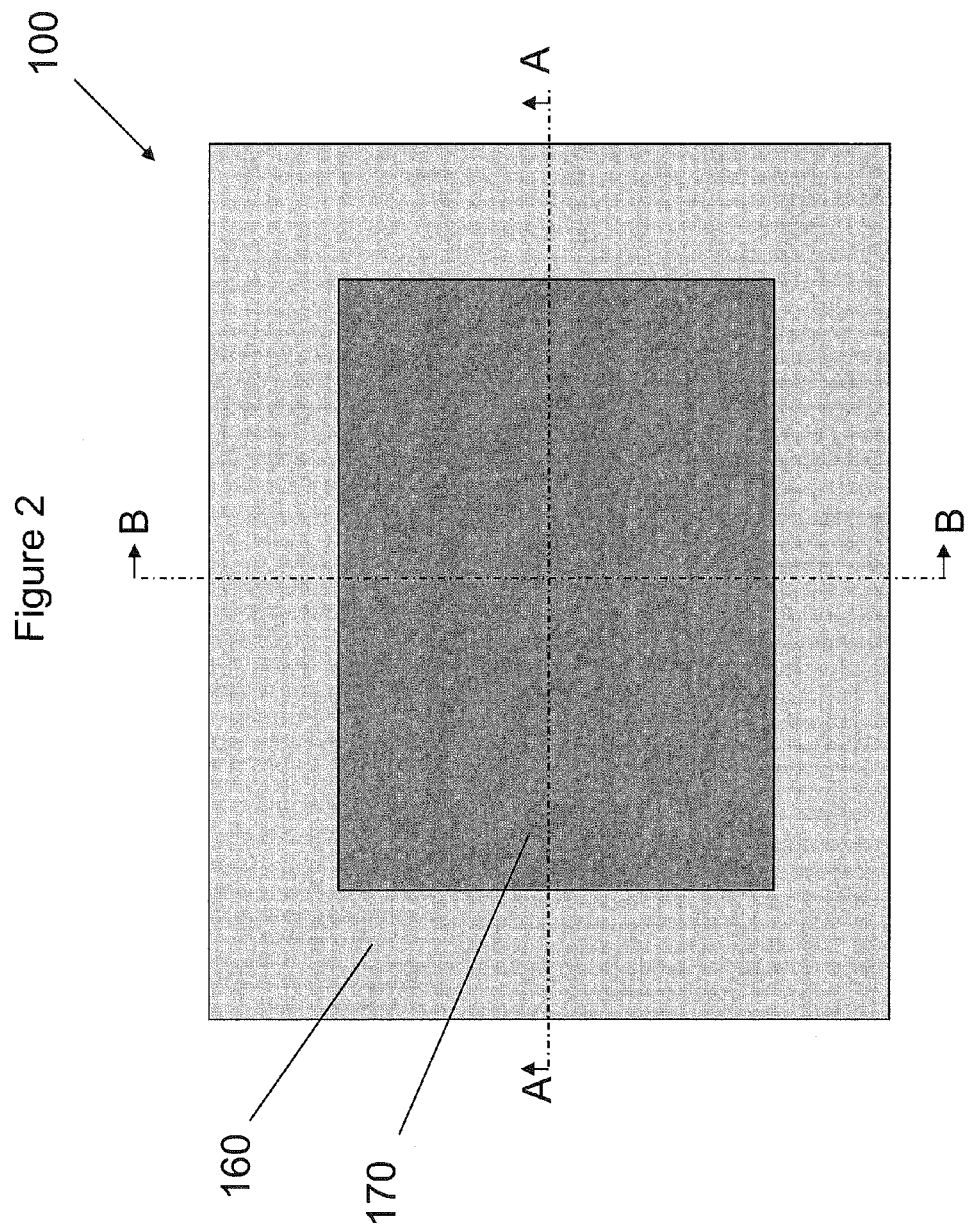

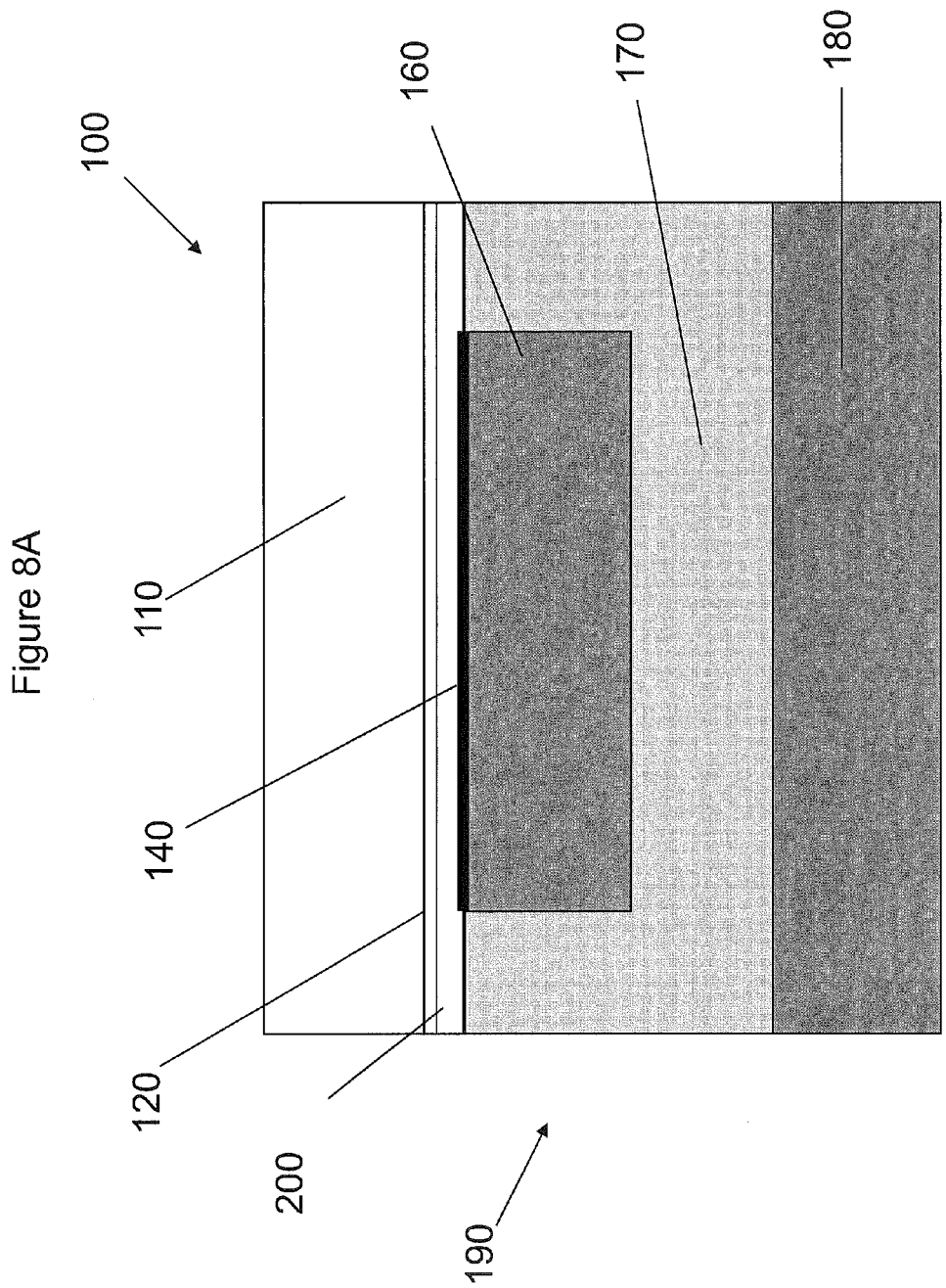

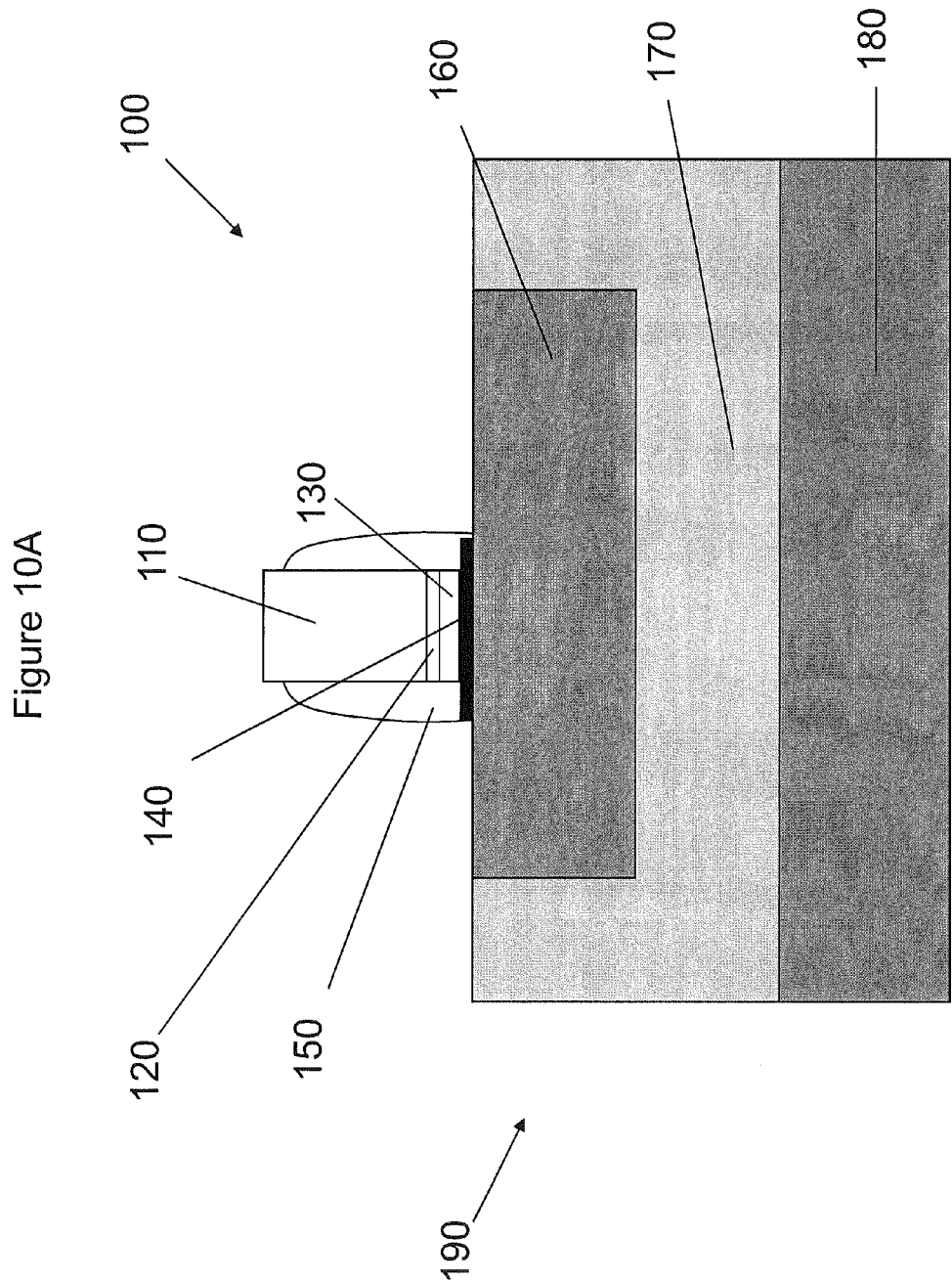

HIGH PERFORMANCE FLASH MEMORY DEVICES

This non-provisional application claims the benefit of the provisional application filed with the U.S. Patent and Trademark Office as Ser. No. 61/148,060 entitled "High Performance Flash Memory Devices", filed Jan. 29, 2009.

BACKGROUND

This disclosure relates to a semiconductor device, and more particularly, to a flash memory device and a method for manufacturing the same.

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM functions as a read and write memory; that is, data may be written into RAM and data may be read from RAM. This is in contrast to read-only memory (ROM), which permits only reading of data. Most RAM is volatile, which means that it requires an uninterrupted source of power to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a memory array which includes a large number of memory cells having electrically isolated gates. Data is stored in the memory cells in the form of charge on the floating gates or floating nodes associated with the gates. Each of the cells within an EEPROM memory array can be electrically programmed in a random basis by charging the floating node. The charge can also be randomly removed from the floating node by an erase operation. Charge is transported to or removed from the individual floating nodes by specialized programming and erase operations, respectively.

Yet another type of non-volatile memory is a Flash memory. A Flash memory is a type of EEPROM that is typically erased and reprogrammed in blocks instead of a single bit or one byte (8 or 9 bits) at a time. A typical Flash memory comprises a memory array, which includes a large number of memory cells. Each of the memory cells includes a floating gate field-effect transistor (FET) capable of holding a charge. The data in a cell is determined by the presence or absence of the charge in the floating gate/charge trapping layer. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

One problem in Flash memory cell arrays is that voltage scalability affects the minimum cell size, and consequently the overall memory density of any resulting array. As integrated circuit (IC) processing techniques improve, manufacturers try to reduce the feature sizes of the devices produced and thus increase the density of the integrated circuits and memory arrays. In modern integrated circuits and memory arrays, as SONOS (Silicon-Oxide-Nitride-Oxide-Silicon) transistors and floating gate memory cells are scaled to smaller feature sizes, the device characteristics of the component transistors and floating gate memory cells can alter and leave the resulting IC or memory device non-functional. These issues include, but are not limited to, short channel effect, signal cross-talk, device programming and operating voltages, reduced logic windows, oxide punch-through, and charge leakage and retention.

Commercially available flash memory generally includes a planar control gate, a planar floating gate, and two interposed dielectric layers. The planar control gate, floating gate, and two dielectric layers are disposed upon a semiconductor substrate.

Due to the two layers of dielectric material in conventional flash memory, it is difficult to scale down the gate length of flash memory. Scaling of the device requires scaling down the gate dielectric, including both gate dielectric layers have been scaled down. Aggressive scaling of gate dielectric thickness may cause large leakage current from the floating gate. This will reduce memory life time of the devices.

For the reasons stated above, and for other reasons stated below which will become apparent to those skilled in the art upon reading and understanding the present specification, there is a need in the art for methods and apparatus for a non-volatile memory cell that allows for feature and voltage scaling, prevents read degradation while providing enhanced retention, speed, endurance, and exhibits increased device integrity.

SUMMARY

Disclosed herein is a flash memory device comprising: a wafer; a gate oxide layer disposed upon the wafer; a floating gate disposed upon the gate oxide layer, the wafer, or a combination thereof; the floating gate comprising a flat floating gate portion and a generally rectangular floating gate portion disposed upon selected areas of the flat floating gate portion; a high K dielectric material disposed upon the floating gate; and a control gate disposed upon the high K dielectric material; wherein the high K dielectric material forms a zigzag pattern coupling the floating gate with the control gate.

Also disclosed herein is a method of manufacturing a flash memory device comprising: forming a gate oxide on a wafer; disposing a first floating gate layer on the wafer; disposing a second floating gate layer on the first floating gate layer; patterning a resist mask over the second floating gate layer; etching to remove at least a portion of the unprotected portions of the second floating gate layer, wherein the first floating gate layer remains substantially intact; wherein the etching defines a second floating gate layer having a plurality of generally rectangular shapes disposed upon the first floating gate layer, wherein the first floating gate layer is substantially flat; removing the resist mask; disposing a high K dielectric material on the second floating gate layer and the first floating gate layer; and disposing a control gate layer on the high K dielectric material; wherein the high K dielectric material forms a zigzag pattern coupling the second floating gate layer and the first floating gate layer with the control gate layer.

BRIEF DESCRIPTION OF THE SEVERAL VIEWS OF THE DRAWINGS

FIGS. 2-10 are various top and cross-sectional views illustrating an exemplary method of forming the structure shown in FIGS. 1A and 1B.

DETAILED DESCRIPTION

Figure 1A:
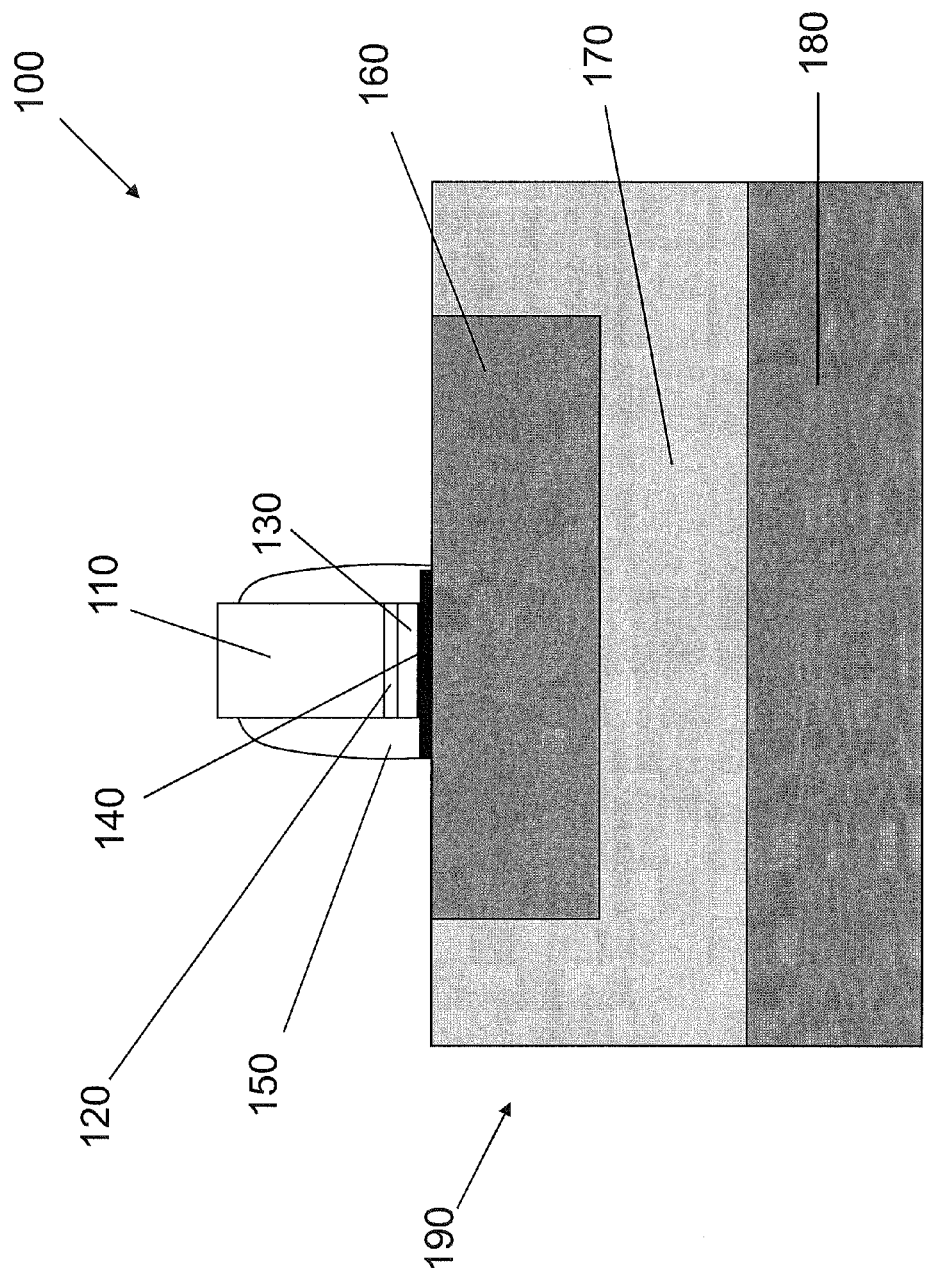
FIG. 1A is a cross-sectional view of a flash memory design having a zigzag capacitance between the control and floating gates.

As disclosed herein, the flash memory device comprising a "zigzag" capacitance between the control gate and the floating gate has a greater capacitance than a device comprising a conventional flat capacitance between the planar control gates and floating gates. The zigzag capacitance increases coupling (control) of the control gate to the floating gate and then to the channel. This improves short-channel effect and allows for improved scaling.

Disclosed herein is a flash memory device comprising: a wafer; a gate oxide layer disposed upon the wafer; a floating gate disposed upon the gate oxide layer, the wafer, or a combination thereof; the floating gate comprising a flat floating gate portion and a generally rectangular floating gate portion disposed upon selected areas of the flat floating gate portion; a high K dielectric material disposed upon the floating gate; and a control gate disposed upon the high K dielectric material; wherein the high K dielectric material forms a zigzag pattern coupling the floating gate with the control gate.

Also disclosed herein is a method of manufacturing a flash memory device comprising: forming a gate oxide on a wafer; disposing a first floating gate layer on the wafer; disposing a second floating gate layer on the first floating gate layer; patterning a resist mask over the second floating gate layer; etching to remove at least a portion of the unprotected portions of the second floating gate layer, wherein the first floating gate layer remains substantially intact; wherein the etching defines a second floating gate layer having a plurality of generally rectangular shapes disposed upon the first floating gate layer, wherein the first floating gate layer is substantially flat; removing the resist mask; disposing a high K dielectric material on the second floating gate layer and the first floating gate layer; and disposing a control gate layer on the high K dielectric material; wherein the high K dielectric material forms a zigzag pattern coupling the second floating gate layer and the first floating gate layer with the control gate layer.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. In flash memory design, it is desired that the capacitance between the control gate and the floating gate is maximized while at the same time minimizing any leakage current through the dielectric layer. The present inventors have unexpectedly discovered that the nonplanar process disclosed herein provides significantly improved coupling between the control gate and the floating gate as compared to conventional flash memory that uses planar floating gates and control gates. The nonplanar process is advantageous because it provides increased capacitance by increasing the area of dielectric, which can increase the controllability of the control gate to channel. This allows for additional scaling down of gate length.

As used herein, the terms wafer and substrate include any base semiconductor structure, including but not limited to, a bulk silicon substrate structure, a silicon-on-sapphire (SOS) structure, a silicon-on-insulator (SOI) structure, a silicon-on-nothing (SON) structure, a thin film transistor (TFT) structure, a doped or undoped semiconductor, or a structure comprising epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The substrate 190 may include a bulk silicon or a silicon-on-insulator (SOI) structure, for example, although other semiconductor materials such as germanium, silicon germanium, silicon germanium-on-insulator, silicon carbide, indium antimonide, indium arsenide, indium phosphide, gallium arsenide, gallium arsenide, etc., are also contemplated. An exemplary semiconductor structure is a silicon-on-insulator (SOI) structure.

Referring to FIGS. 1 through 10B, there is shown a sequence of top and cross sectional views illustrating a method of forming gate structures for flash memory devices, in accordance with one embodiment. It is to be noted that in the text as well as in all of the Figures, the respective structures will be termed the "device" and will be referred to by the number "100" though the device is not yet a flash memory device 100 until the last stages of manufacturing described herein. This is done primarily for the convenience of the reader.

Figure 1B:
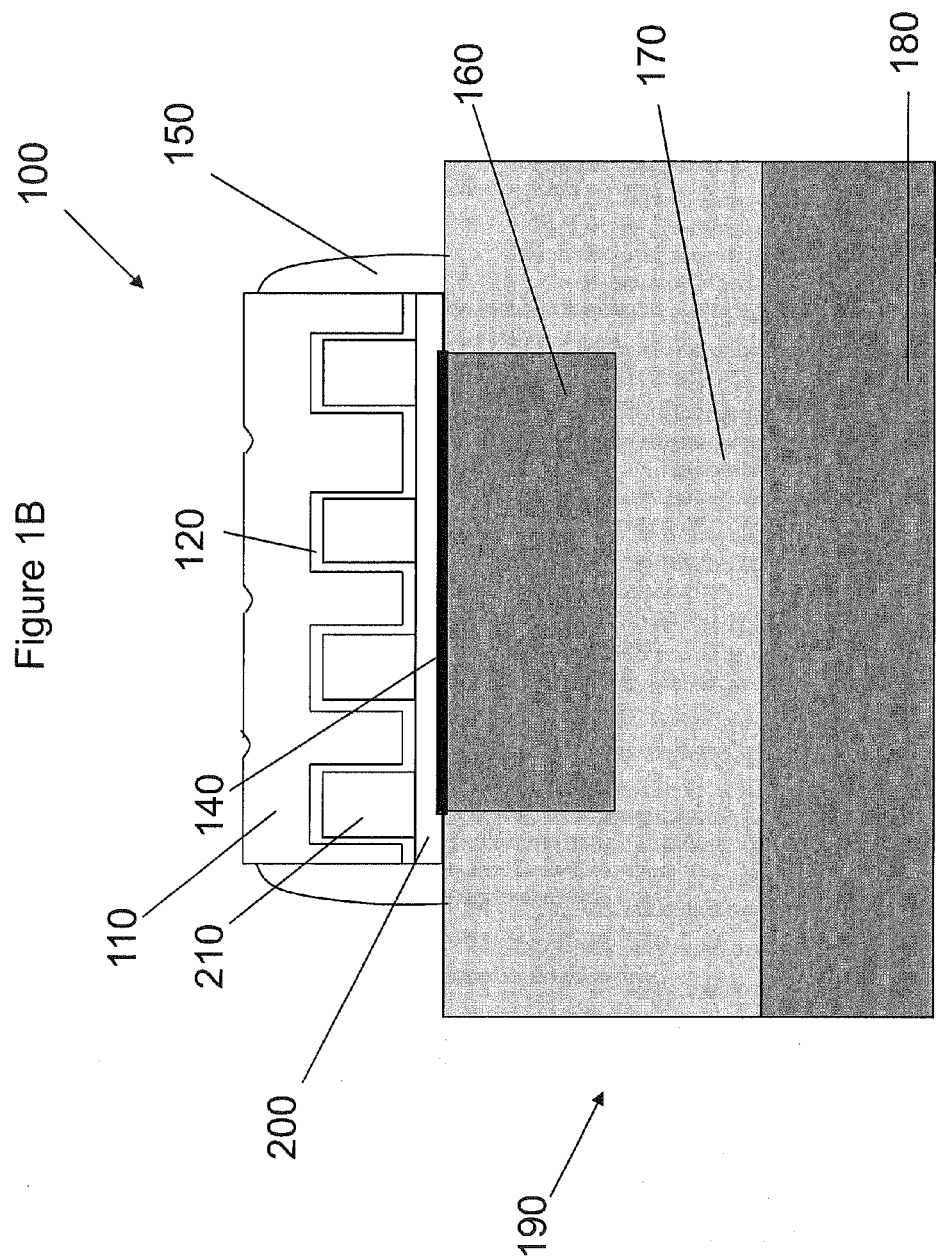
FIG. 1B is another cross-sectional view of the flash memory design having a zigzag capacitance between the control and floating gates, orthogonal to the view shown in FIG. 1A.

In an embodiment disclosed in FIGS. 1A and 1B, a flash memory device comprises a control gate 110 disposed upon a gate dielectric layer 120. The gate dielectric layer 120 is disposed upon a floating gate 130. The floating gate 130 is disposed upon a gate oxide 140. As shown in FIGS. 1A and 1B, these components are stacked in a vertical arrangement. The a control gate 110 is on top of a gate dielectric layer 120, which is on top of a floating gate 130, which is on top of a gate oxide 140. As shown in FIGS. 1A and 1B, a nitride spacer 150 is disposed on the sides of the vertically arranged control gate 110; gate dielectric layer 120; floating gate 130; and gate oxide 140. As shown in FIGS. 1A and 1B, the gate oxide 140 is disposed upon a wafer 190.

In one embodiment, the wafer 190 comprises a semiconductor-on-insulator (SOI) structure 160 having a buried oxide (BOX) layer 170 and an adjoining substrate 180. In an exemplary embodiment, the gate oxide 140 is disposed upon the SOI structure 160 of the wafer 190. The substrate 180 may comprise germanium, silicon, or a combination of germanium and silicon such as silicon-germanium. In an exemplary embodiment, the semiconductor substrate 180 comprises silicon. The substrate 180 has a BOX layer 170 disposed thereon.

In one embodiment, the BOX layer 170 can comprise silicon dioxide produced by doping the silicon substrate 180 with oxygen as a dopant. An ion beam implantation process followed by high temperature annealing can be used to form a BOX layer 170. In another embodiment, the SOI wafer can be manufactured by wafer bonding, where the BOX layer 170 and the SOI layer 160 can be separately adhered to the substrate 180.

The silicon-on-insulator (SOI) layer 160 is disposed upon the BOX layer 113 and generally has a thickness of about 50 to about 210 nanometers. In one embodiment, the SOI layer is implanted with a P+ dopant such as boron or an N+ dopant such as arsenic, phosphorus and gallium and annealed to activate the dopant. In another embodiment, the source/drain and extension areas of the SOI layer are implanted with a P+ dopant or an N+ dopant and annealed to activate the dopant. The dopant is generally added in a concentration of about $10^{19}$ to about $10^{21}$ atoms/cm$^3$.

According to another embodiment, the gate dielectric layer 120 is a deposited dielectric material, such as, for example, a high K dielectric material, including, for example, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination of at least one of the foregoing high K dielectric materials. An exemplary dielectric material is hafnium oxide ($HfO_2$). Although not specifically shown in the Figures, the gate stack may also include another high K dielectric layer formed on gate dielectric layer 120. The gate dielectric layer 120 may be formed on the substrate 100 and STI regions using a deposition method, e.g., a chemical vapor deposition (CVD), a low pressure CVD, a plasma enhanced CVD (PECVD), an atomic layer CVD, a physical vapor deposition (PVD), or a combination of at least one of the foregoing deposition methods.

FIG. 1B is another cross-sectional view of the flash memory design having a zigzag capacitance between the control and floating gates, orthogonal to the view shown in FIG. 1A. In this view, it will be seen that the gate dielectric layer 120 is disposed upon floating gate 130 that comprises a generally rectangular floating gate portion 210 and a substantially flat basal floating gate portion 200. As used herein, "generally rectangular" refers to a substantially square or rectangular geometric shape.

In one embodiment, the floating gate 130 comprises a material such as poly-Si, poly-SiGe, a conductive metal, such as tungsten and molybdenum, a conductive metal nitride, such as titanium nitride, tantalum nitride, and tungsten nitride, or a combination comprising at least one of the foregoing materials. In one embodiment, the generally rectangular floating gate portion 210 comprises poly-SiGe, a conductive metal, such as tungsten and molybdenum, a conductive metal nitride, such as titanium nitride, tantalum nitride, and tungsten nitride, or a combination comprising at least one of the foregoing materials. In one embodiment, the flat basal floating gate portion 200 comprises poly-Si. In another embodiment, the generally rectangular floating gate portion 210 comprises poly-SiGe and the flat basal floating gate portion 200 comprises poly-Si.

In one embodiment, the control gate 110 comprises a material such as poly-Si, poly-SiGe, a conductive metal, such as tungsten and molybdenum, a conductive metal nitride, such as titanium nitride, tantalum nitride, and tungsten nitride, or a combination comprising at least one of the foregoing materials. In one embodiment, the control gate 110 comprises poly-Si.

As shown in FIG. 1B, the gate dielectric layer 120 is disposed upon both the generally rectangular floating gate portion 210 and the flat basal floating portion 200. The generally rectangular floating gate portion 210 is disposed upon the flat basal floating gate portion 200, which, in turn, is disposed upon the gate oxide 140. Referring now to both FIGS. 1A and 1B, the control gate 110 substantially covers the rectangular floating gate portion 210 in a tongue-in-groove or intercalating comb-like structure. The interposed gate dielectric 120 thus forms a zigzag pattern as it couples the control gates 110 and floating gates 130. The basal floating gate portion 200 is not covered by the control gate 110 and thus is visible in the cross-section view shown in FIG. 1A.

FIGS. 2-10 are various top and cross-sectional views illustrating an exemplary method of forming the structure shown in FIGS. 1A and 1B.

Figure 3:
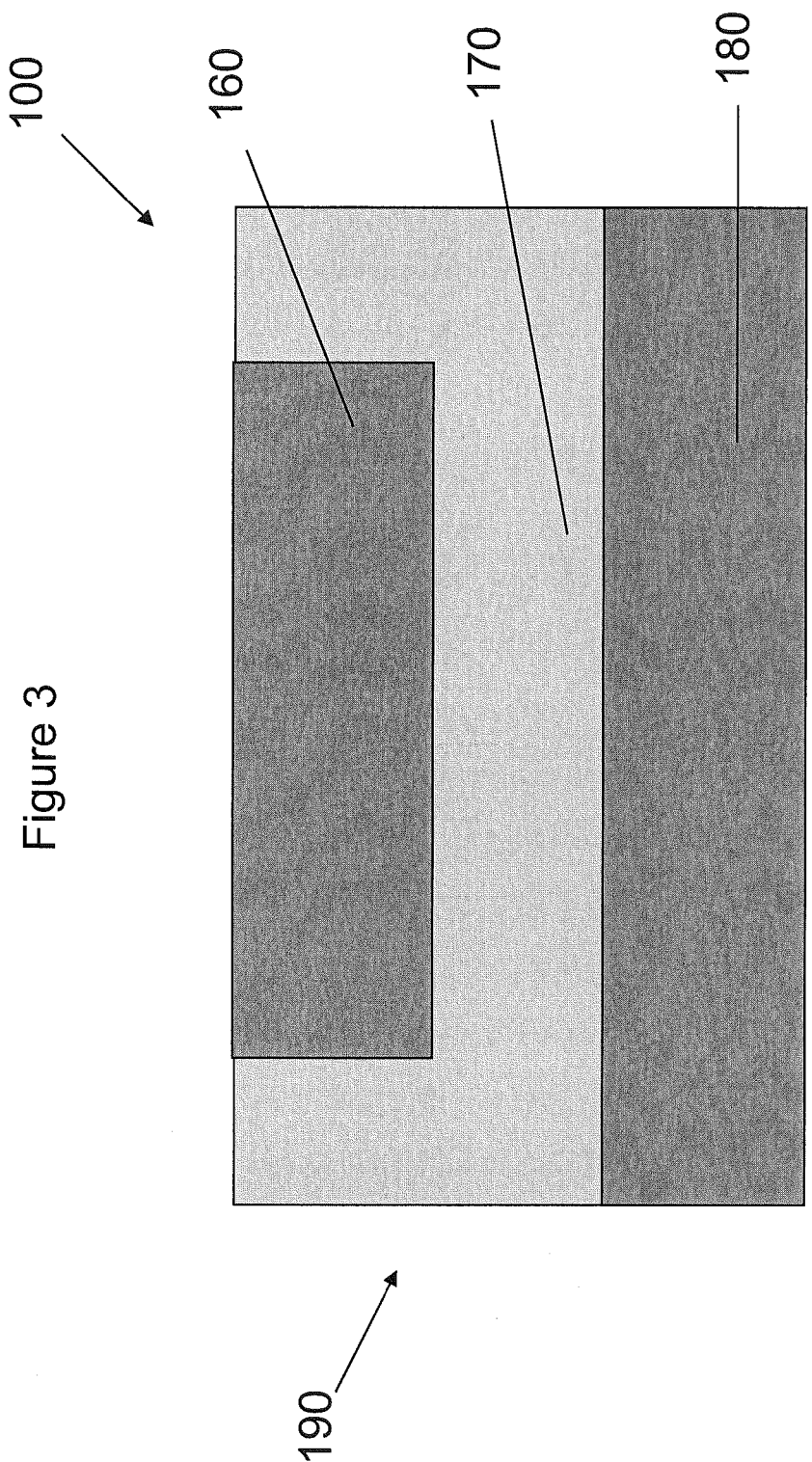

FIG. 2 is a top view of a silicon trench isolation (STI) formed on a wafer. The STI oxide of the BOX layer 160 surrounds the active area of the SOI layer 170. FIG. 3 shows a cross-section of the wafer 190 cut along A-A that shows the SOI layer 160; the BOX layer 170; and the substrate 180.

Figure 4:
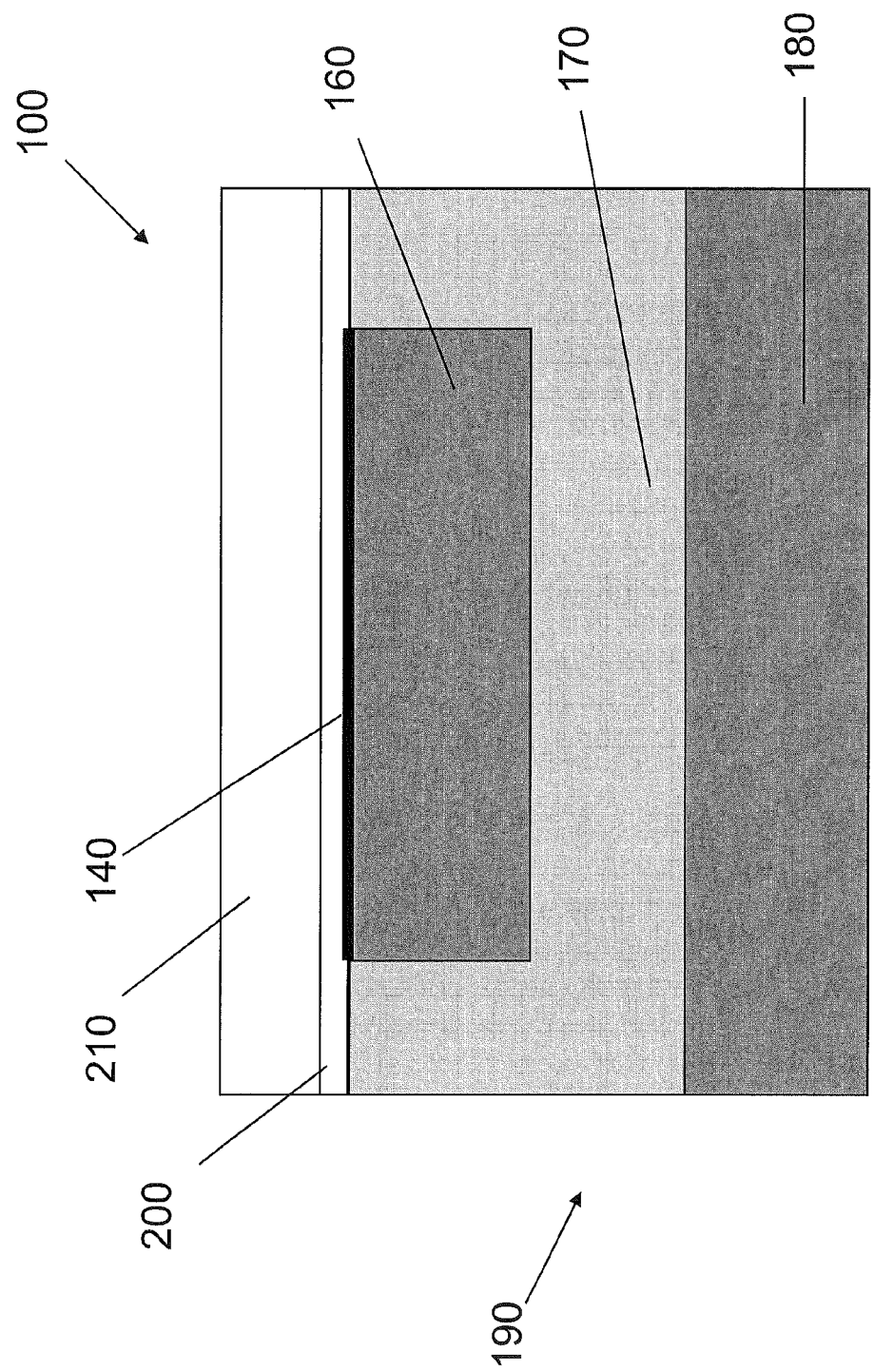

FIG. 4 is a cross-sectional view of the device 100 cut along A-A. following formation of a gate oxide 140 by thermal oxidation on the wafer 190. In an embodiment, the gate oxide 140 may include a silicon dioxide dielectric film grown with a dry/wet oxidation process. In an embodiment, the silicon oxide film may be grown to a thickness of between about 5 to about 15 Angstroms. A first floating gate layer 200 is disposed on the wafer 190 and the gate oxide 140. A second floating gate layer 210 is disposed on the first floating gate layer 200.

Figure 5:
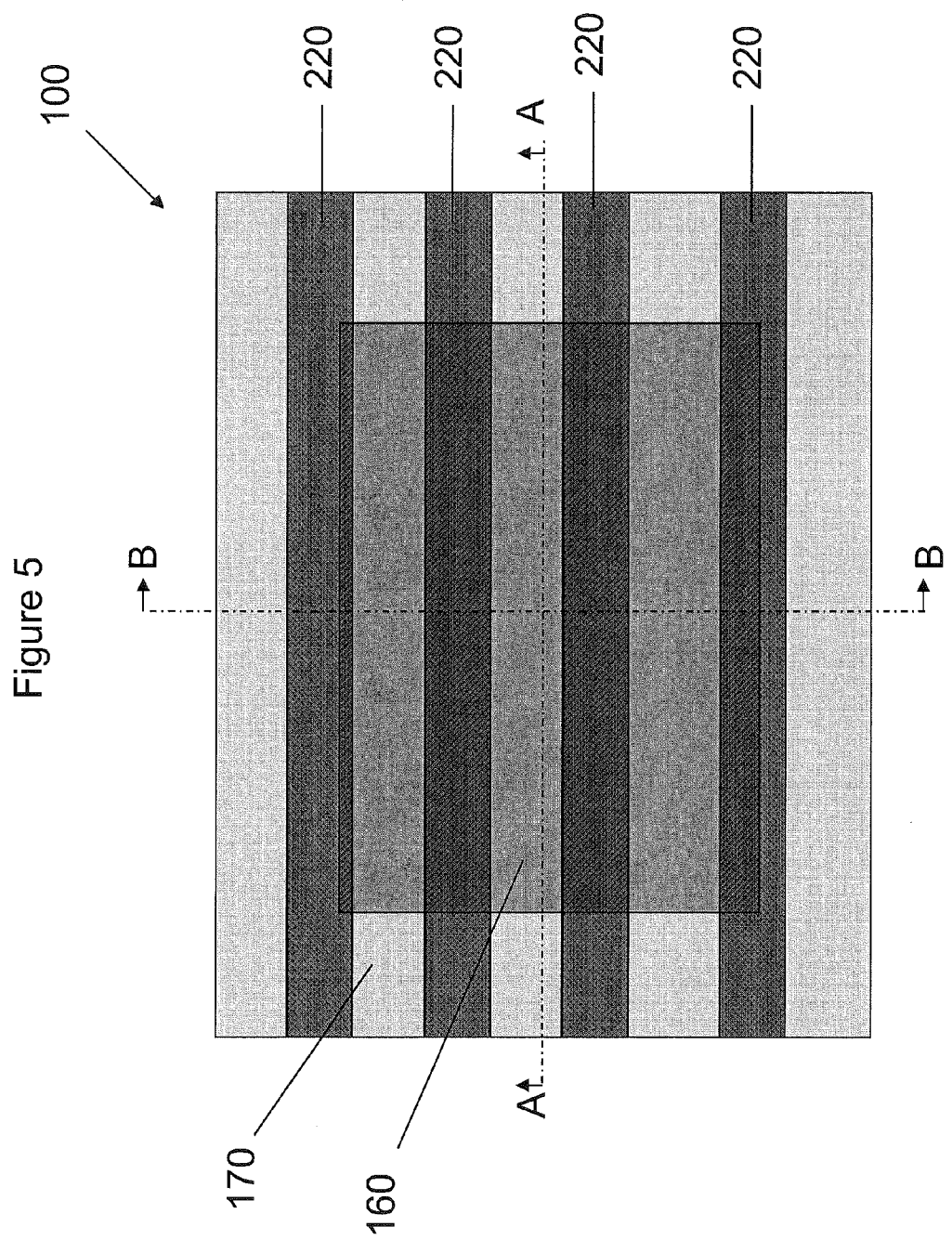

FIG. 5 is a top view of the device 100 having a resist mask 220 patterned over the STI oxide of the BOX layer 170 and the active area of the SOI layer 160. In one embodiment, the resist mask is patterned in parallel stripes that are substantially parallel to A-A.

Figure 6A:
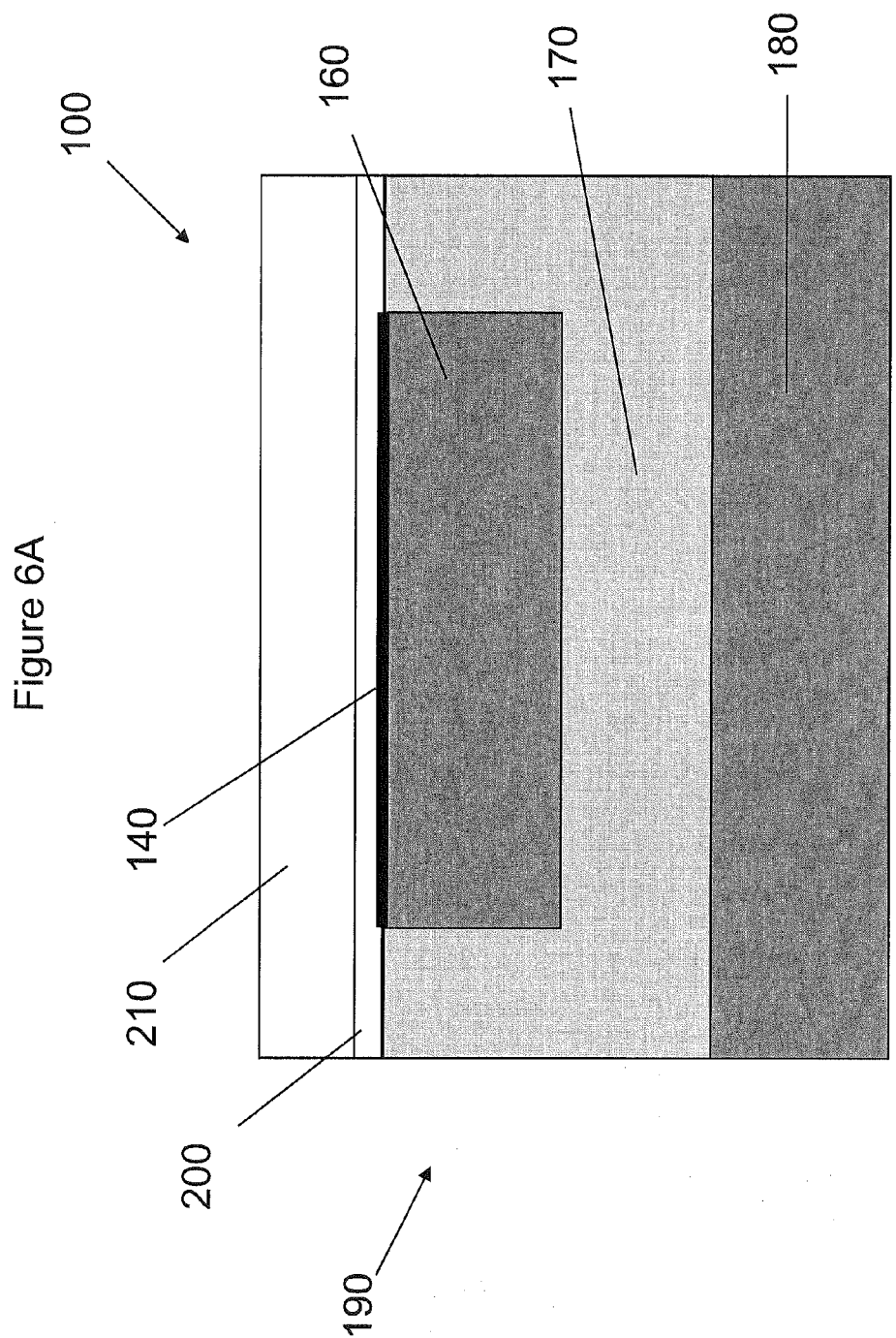
Figure 6B:
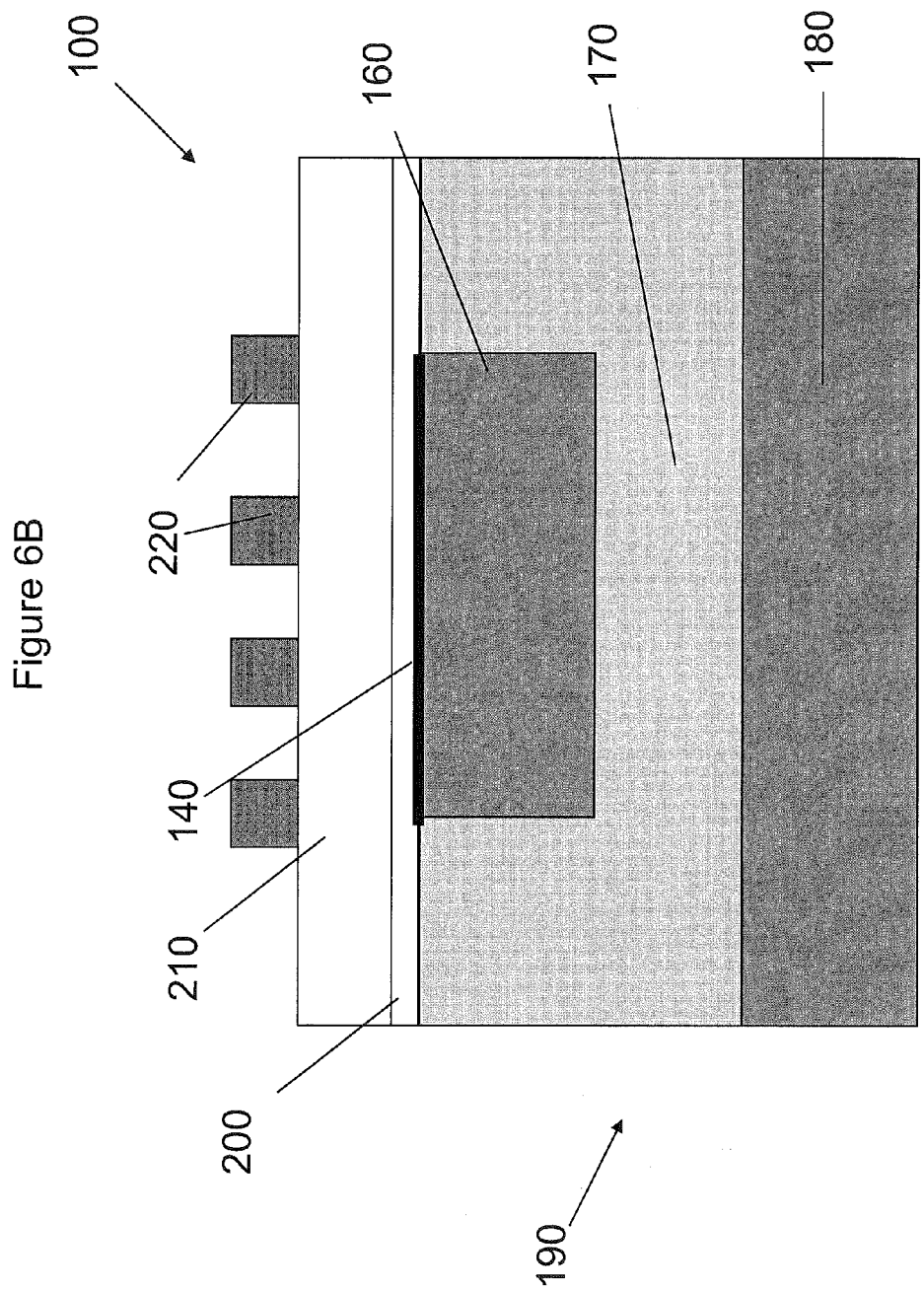

As shown in FIGS. 6A and 6B, following patterning, a resist mask 220 is disposed upon on the second floating gate layer 210. FIG. 6A shows a cross-section cut along A-A, where no resist mask is present. Thus, looking at this cross-section, FIG. 6A shows a first floating gate layer 200 disposed on the wafer 190 and the gate oxide 140, and a second floating gate layer 210 disposed on the first floating gate layer 200. FIG. 6B shows a cross-section cut along B-B, where a resist mask is present. Looking at this cross-section, FIG. 6B shows a resist disposed on the second floating gate layer 210.

Figure 7A:
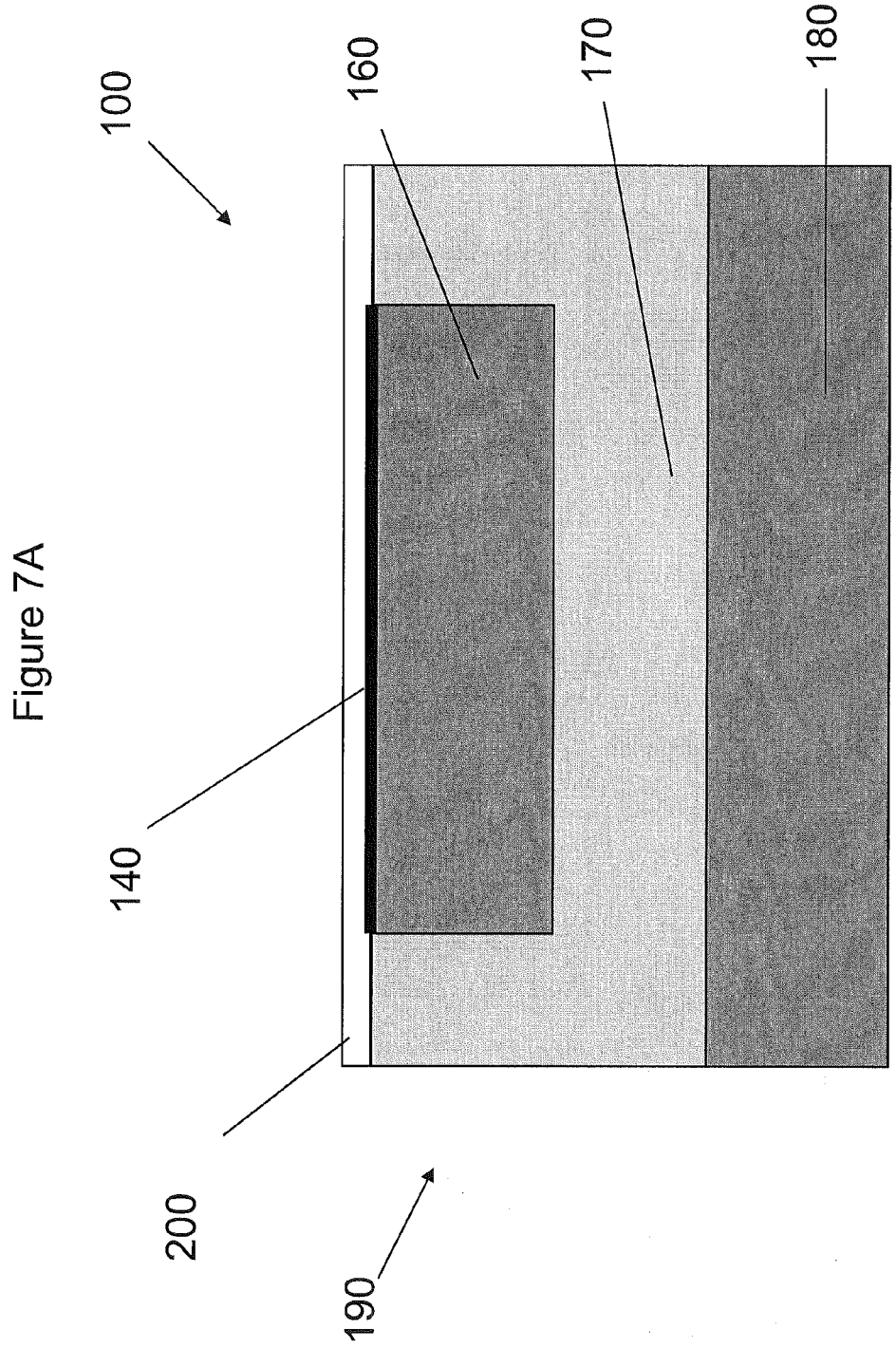
Figure 7B:
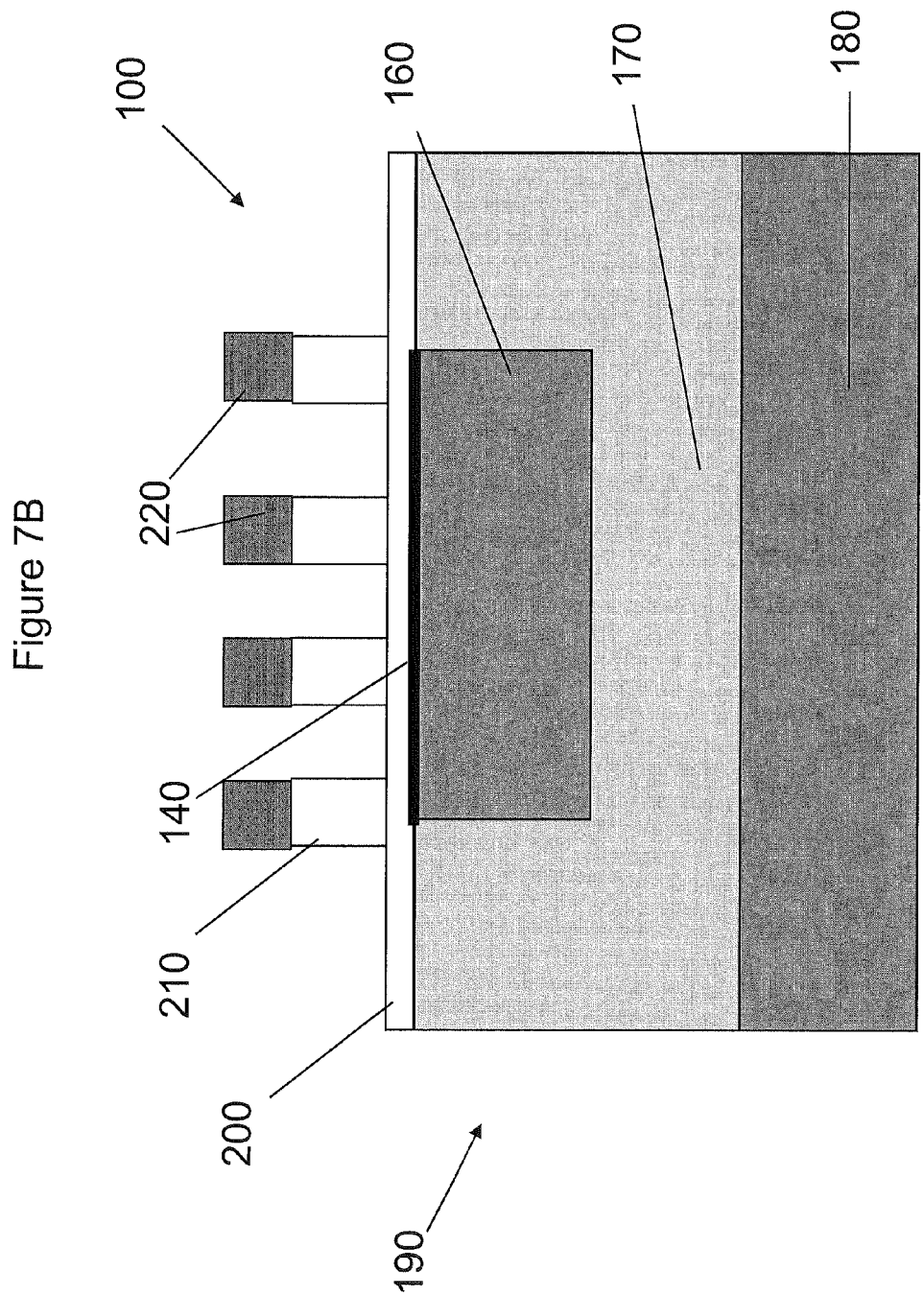

Following the patterning of the resist 220, a reactive ion etch (RIE) is performed that selectively removes the unprotected second floating gate layer 210 leaving the first floating gate layer 200. In another embodiment, the RIE partially removes the second floating gate layer 210 leaving a layer of poly-SiGe (not shown) disposed upon the first floating gate layer 200. As shown in FIGS. 7A and 7B, following the RIE, the unprotected poly-SiGe layer is removed 210. FIG. 7A is a cross-sectional view cut along A-A, where no resist mask 220 is present, after etching. FIG. 7A shows a first floating gate layer 200 disposed on the wafer 190 and the gate oxide 140. FIG. 7B is a cross-sectional view cut along B-B, where a resist mask 220 is present, after etching. Looking at this cross-section, FIG. 7B shows the protected second floating gate layer 210 is now formed into generally rectangular shapes after the RIE.

Figure 8B:
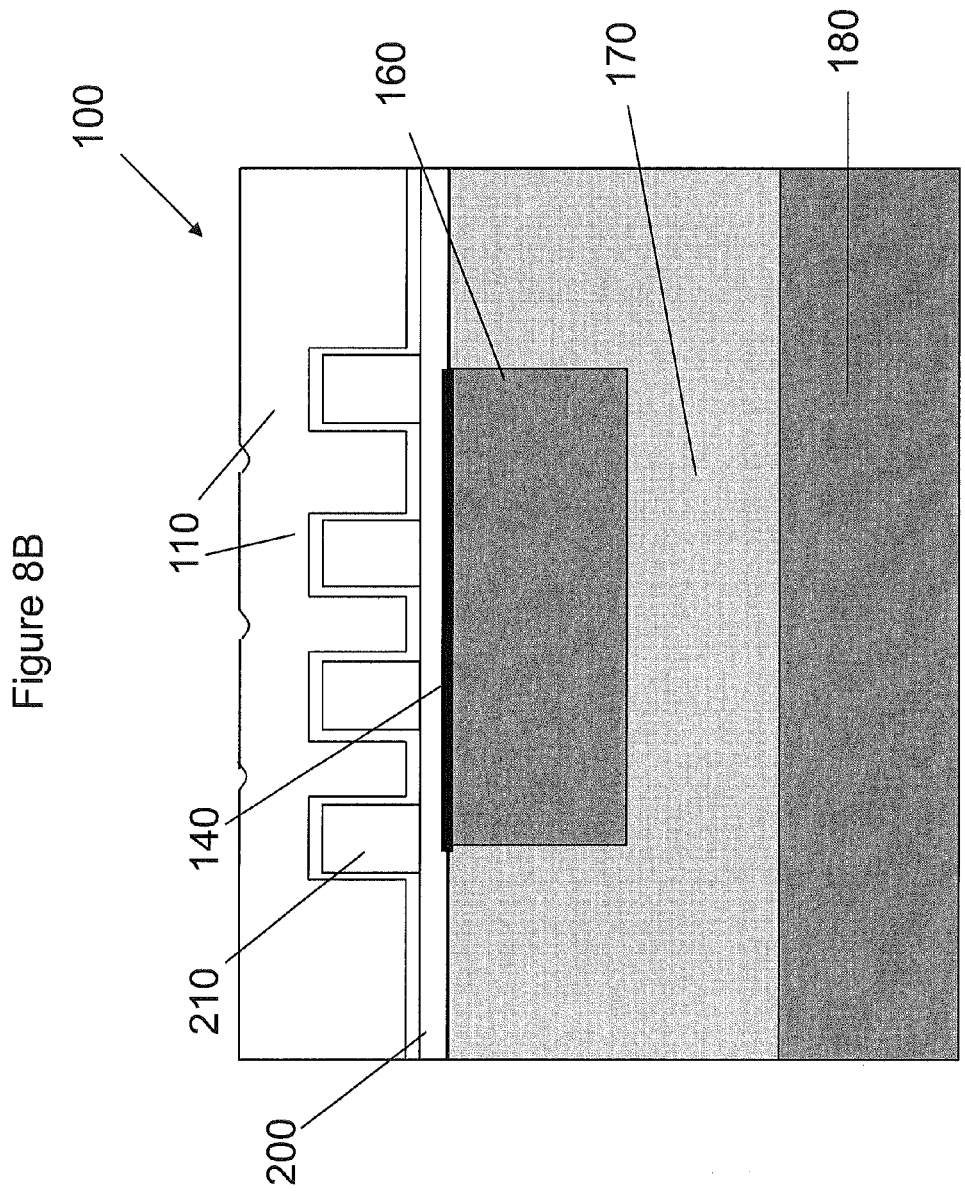

Following the RIE of the second floating gate layer 210, the resist 220 is removed. Following removal of the resist, a high-dielectric material 120 is then disposed on the entire device 100 to a depth of about 3 to about 5 nanometers. Another layer of in-situ doped poly-Si 200 is subsequently disposed on the high-dielectric material 120. As shown in FIGS. 8A and 8B, the device 100 now comprises a control gate layer 110 disposed on a high-dielectric material layer 120 that is in turn disposed on a second floating gate layer 210 that is formed into generally rectangular shapes and a flat basal first floating gate layer 200. FIG. 8A is a cross-sectional view cut along A-A. In this view, FIG. 8A shows a control gate layer 110 disposed on a high-dielectric material layer 120 that is in turn disposed on a flat basal first floating gate layer 200.

FIG. 8B is a cross-sectional view cut along B-B. Looking at this cross-section, FIG. 8B shows a control gate layer 110 disposed on a high-dielectric material layer 120 that is in turn disposed on a second floating gate layer 210 that is formed into generally rectangular shapes and a flat basal first floating gate layer 200. The interposed high K dielectric material 120 thus forms a zigzag pattern as it couples the control gate layer 110 and the rectangular second floating gate layer 210 and the flat first floating gate layer 200. The rectangular second floating gate layer 210 is substantially covered by the control gate layer 110 and thus is hidden in the cross-section view shown in FIG. 8A.

Figure 9A:
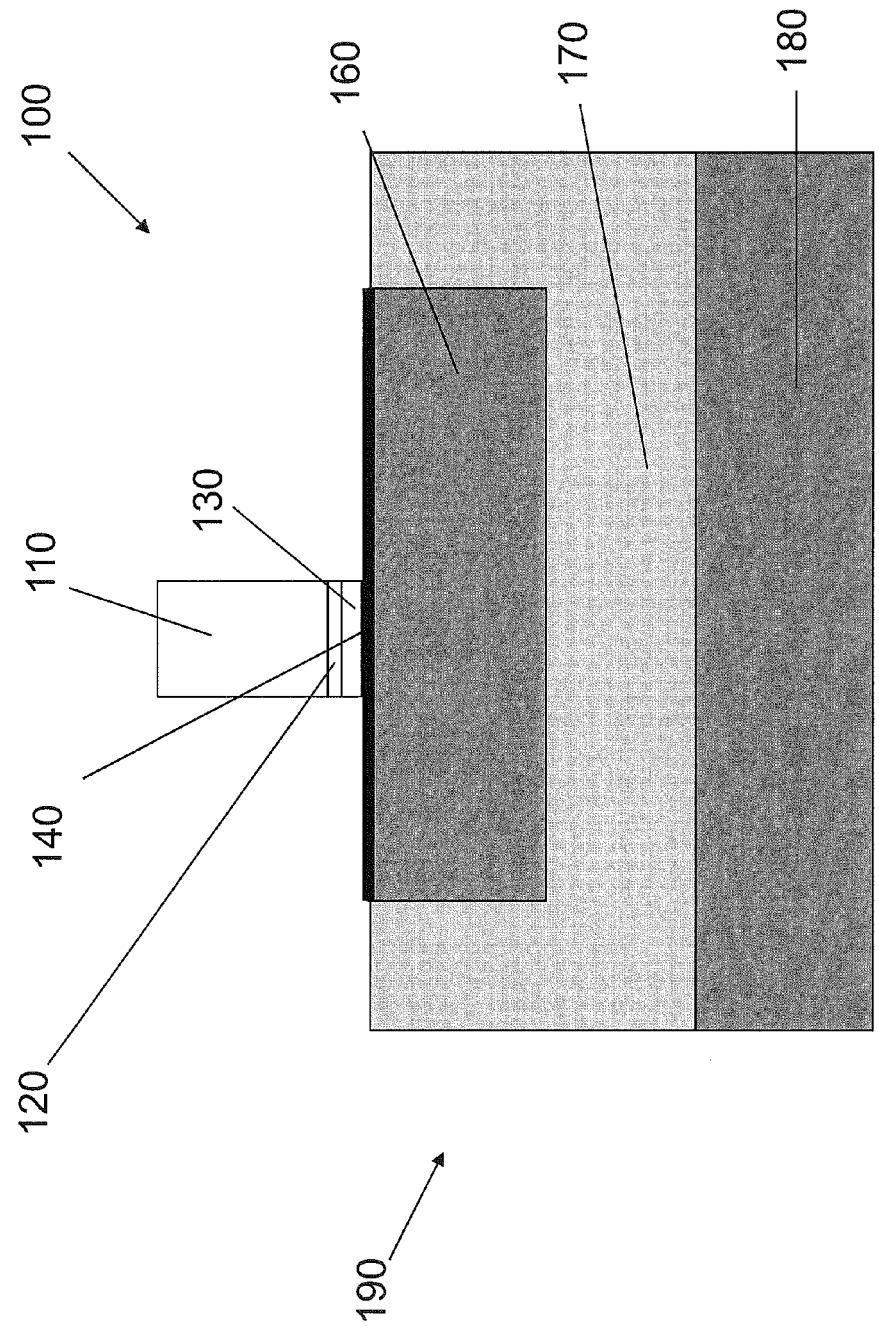
Figure 9B:
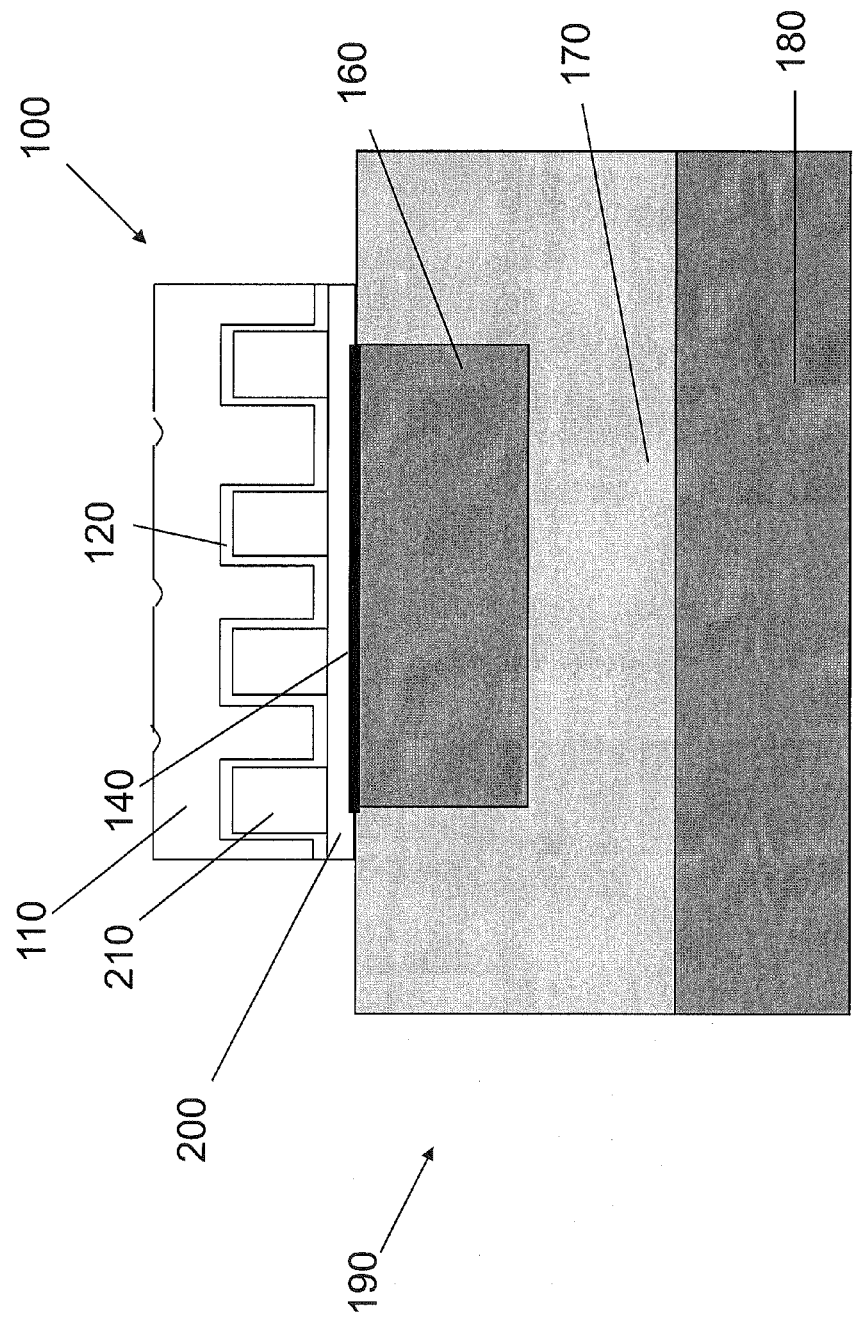

Following formatting of the zigzag pattern, the device is further patterned by a series of resists, depositions, patterning, and etches to pattern the control gate layer 110, the high-dielectric material layer 120, and the second floating gate layer 210 and the first floating gate layer 200 to form a gate conductor. FIGS. 9A and 9B. The etching can all be accomplished via RIE. In one embodiment, a single RIE may be conducted to remove all the layers. In another embodiment, different RIEs may be conducted to remove different layers. For example, a first RIE may be conducted to remove the control gate layer 110. A second RIE may be conducted to remove the high-dielectric material layer 120, while a third and fourth RIE may be conducted to remove the second floating gate layer 210 and the first floating gate layer 200, respectively. The RIE can be conducted with halogenated compounds such as $CHF_3$, $Cl_2$, $CF_4$, $SF_6$, or the like, or a combination comprising at least one of the foregoing halogenated compounds.

Figure 10B:
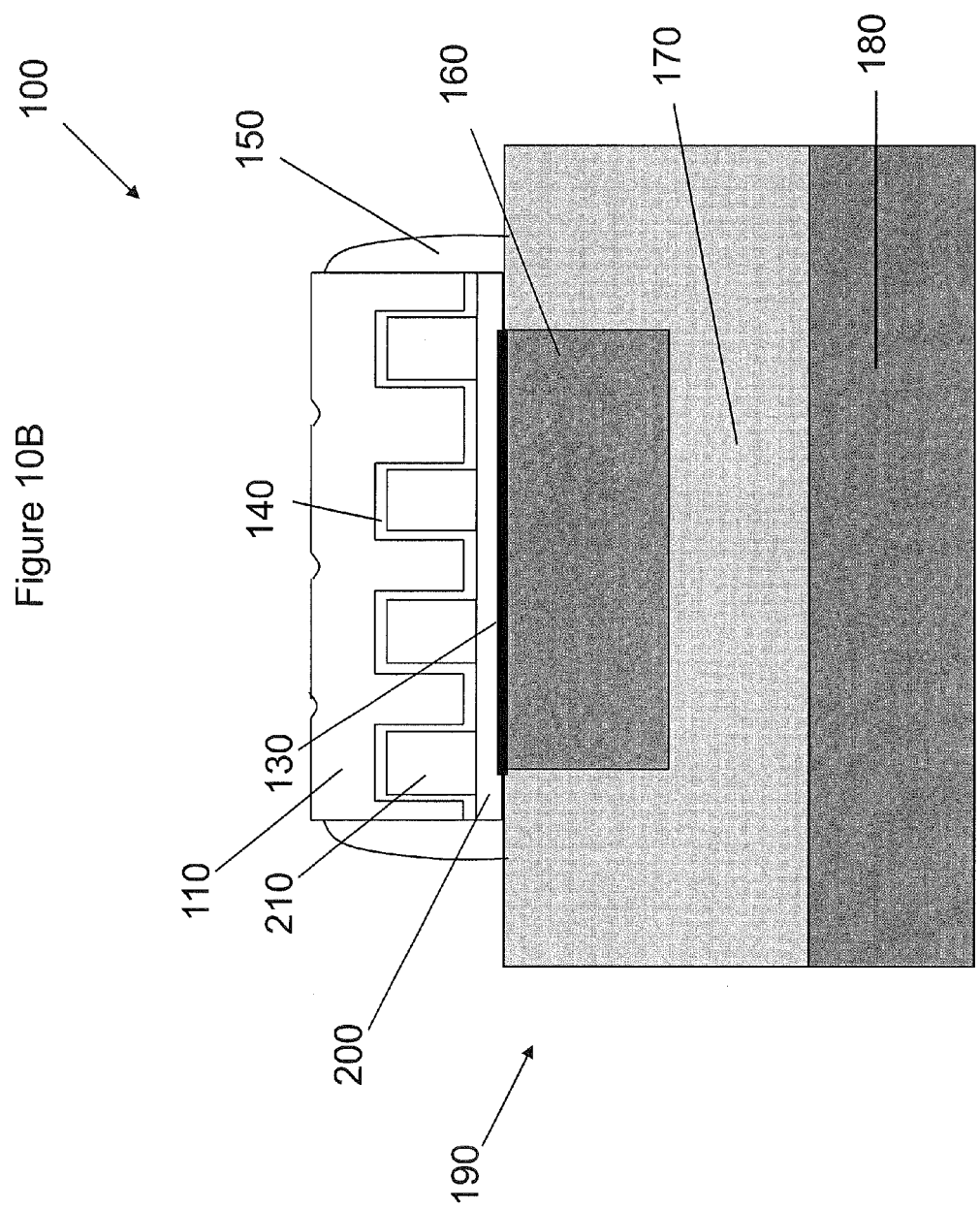

In one embodiment, other process may be performed to complete the building of the device 100. These processes include, for example, halo and extension implant; spacer formation, and SD implant and SD anneal to activate dopants. FIGS. 10A and 10B show cross-section views of a finished embodiment of the device 100.

In the embodiment disclosed in FIGS. 2-10B, the floating gate 130 comprises a material such as poly-Si, poly-SiGe, a conductive metal, such as tungsten and molybdenum, a conductive metal nitride, such as titanium nitride, tantalum nitride, and tungsten nitride, or a combination comprising at least one of the foregoing materials. In one embodiment, the first floating gate portion 200 comprises poly-Si. In one embodiment, the second floating gate portion 210 comprises poly-SiGe, a conductive metal, such as tungsten and molybdenum, a conductive metal nitride, such as titanium nitride, tantalum nitride, and tungsten nitride, or a combination comprising at least one of the foregoing materials. In another embodiment, the first floating gate portion 200 comprises poly-Si and the second floating gate portion 210 comprises poly-SiGe.

In one embodiment, the control gate 110 comprises a material such as poly-Si, poly-SiGe, a conductive metal, such as tungsten and molybdenum, a conductive metal nitride, such as titanium nitride, tantalum nitride, and tungsten nitride, or a combination comprising at least one of the foregoing materials. In one embodiment, the control gate 110 comprises poly-Si.

This device is advantageous in that the capacitance between the zigzag control gate and the floating gate is greater than that of a flat gate structure, which, in turn, increases coupling of the control gate to the floating gate and then to the channel. This improves short-channel effect and allows for improved scaling to reduce the size of the flash memory device.)

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A flash memory device comprising:
a wafer;
a gate oxide layer disposed upon the wafer;
a floating gate disposed upon the gate oxide layer, the wafer, or a combination thereof;
the floating gate comprising a continuous, flat floating gate portion and a plurality of generally rectangular floating gate portions disposed upon selected areas of the continuous, flat floating gate portion;
a high K dielectric material disposed upon the floating gate;
a control gate disposed upon the high K dielectric material; and
a spacer disposed on side surfaces of the control gate, the high K dielectric material, and the floating gate, and the spacer disposed on a top surface of a buried oxide (BOX) layer;
wherein the high K dielectric material forms a zigzag pattern coupling the floating gate with the control gate.

2. The flash memory device of claim 1, wherein the flash memory device further comprises a nitride spacer.

3. The flash memory device of claim 1, wherein the wafer is a base semiconductor structure.

4. The flash memory device of claim 3, wherein the base semiconductor structure is a bulk silicon substrate structure, a silicon-on-sapphire (SOS) structure, a silicon-on-insulator (SOI) structure, a silicon-on-nothing (SON) structure, a thin film transistor (TFT) structure, a doped or undoped semiconductor, a structure comprising epitaxial layers of silicon supported by a base semiconductor, or a combination of at least one of the foregoing structures.

5. The flash memory device of claim 4, wherein the base semiconductor structure is a silicon-on-insulator (SOI) structure.

6. The flash memory device of claim 1, wherein the wafer comprises a silicon-on-insulator (SOI) layer, the BOX layer, and a substrate layer.

7. The flash memory device of claim 6, wherein the substrate layer comprises germanium, silicon, or a combination of germanium and silicon such as silicon-germanium.

8. The flash memory device of claim 1, wherein the generally rectangular floating gate portions comprise poly-silicon-germanium (poly-SiGe), a conductive metal, such as tungsten and molybdenum, a conductive metal nitride, such as titanium nitride, tantalum nitride, and tungsten nitride, or a combination comprising at least one of the foregoing materials, and the continuous, flat floating gate portions comprise poly-silicon (poly-Si).

9. The flash memory device of claim 1, wherein the generally rectangular floating gate portions comprise poly-SiGe, and the continuous, flat floating gate portion comprises poly-Si.

10. The flash memory device of claim 1, wherein the high K dielectric material comprises hafnium oxide.

11. The flash memory device of claim 1, wherein the control gate comprises poly-Si.

12. A method of manufacturing a flash memory device comprising:
    forming a gate oxide on a wafer;
    disposing a first floating gate layer on the wafer;
    disposing a second floating gate layer on the first floating gate layer;
    patterning a resist mask over the second floating gate layer;
    etching to remove at least a portion of the unprotected portions of the second floating gate layer, wherein the first floating gate layer remains substantially intact;
    wherein the etching defines a second floating gate layer having a plurality of generally rectangular shapes disposed upon the first floating gate layer, wherein the first floating gate layer is substantially flat;
    removing the resist mask;
    disposing a high K dielectric material on the second floating gate layer and the first floating gate layer;
    disposing a control gate layer on the high K dielectric material; and
    forming a spacer disposed on side surfaces of the control gate, the high K dielectric material, and the floating gate, and the spacer disposed on a top surface of a buried oxide (BOX) layer;
    wherein the high K dielectric material forms a zigzag pattern coupling the second floating gate layer and the first floating gate layer with the control gate layer.

13. The method of claim 12 further comprising a second etching to pattern the first floating gate layer, the high-dielectric material layer, the second floating gate layer and the control gate layer.

14. The method of claim 12 further comprising halo and extension implant, spacer formation, and SD implant and SD anneal to activate dopants.

15. The method of claim 12, wherein the first floating gate layer comprises poly-silicon (poly-Si), and the second floating gate layer comprises poly-silicon-germanium (poly-SiGe), a conductive metal, such as tungsten and molybdenum, a conductive metal nitride, such as titanium nitride, tantalum nitride, and tungsten nitride, or a combination comprising at least one of the foregoing materials.

16. The method of claim 12, wherein the first floating gate layer comprises poly-Si, and the second floating gate layer comprises poly-SiGe.

17. The method of claim 12, wherein the high K dielectric material comprises hafnium oxide.

18. The method of claim 12, wherein the control gate comprises poly-Si.

19. The method of claim 12, wherein the etching substantially removes the unprotected portions of second floating gate layer.

20. A flash memory device manufactured by the method of claim 12.

* * * * *